(12) United States Patent
Otani et al.

(10) Patent No.: US 11,903,115 B2
(45) Date of Patent: Feb. 13, 2024

(54) HEATING COOKER

(71) Applicant: Panasonic Intellectual Property Management Co., Ltd., Osaka (JP)

(72) Inventors: Ryosuke Otani, Shiga (JP); Hiroyuki Katsube, Shiga (JP); Masato Yota, Nara (JP); Seiichi Yamashita, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1294 days.

(21) Appl. No.: 16/465,367

(22) PCT Filed: Dec. 4, 2017

(86) PCT No.: PCT/JP2017/043404
§ 371 (c)(1),
(2) Date: May 30, 2019

(87) PCT Pub. No.: WO2018/154905
PCT Pub. Date: Aug. 30, 2018

(65) Prior Publication Data
US 2019/0394839 A1    Dec. 26, 2019

(30) Foreign Application Priority Data
Feb. 24, 2017   (JP) .................. 2017-033862

(51) Int. Cl.
*H05B 6/64*    (2006.01)
*H05B 6/68*    (2006.01)
(Continued)

(52) U.S. Cl.
CPC ............. *H05B 6/6423* (2013.01); *F24C 7/08* (2013.01); *H02P 6/16* (2013.01); *H03K 19/21* (2013.01)

(58) Field of Classification Search
CPC ... F24C 7/08; F24C 7/085; H02P 6/16; H03K 19/21; H05B 6/642; H05B 6/6423; H05B 6/6473; H05B 6/745
(Continued)

(56) References Cited

U.S. PATENT DOCUMENTS 6,108,179 A    8/2000   Katae et al.
6,571,564 B2*  6/2003   Upadhye ............. A47J 36/2438
                                                   62/62

FOREIGN PATENT DOCUMENTS

DE    102012204234    9/2013
DE    102012222155    6/2014
(Continued)

OTHER PUBLICATIONS

International Search Report of PCT application No. PCT/JP2017/043404 dated Feb. 27, 2018.
Extended European Search Report dated Jan. 20, 2020 in related European Patent Application No. 17897772.4.

*Primary Examiner* — Quang T Van
(74) *Attorney, Agent, or Firm* — Wenderoth, Lind & Ponack, L.L.P.

(57) ABSTRACT

A heating cooker includes a heating chamber, a heating portion, a brushless motor, a body control circuit, a DC power supply circuit, a motor control circuit, and a safety device. The brushless motor drives a rotary drive mechanism included in the heating portion. The body control circuit outputs a drive signal for the brushless motor. The DC power supply circuit supplies DC power to the brushless motor. The motor control circuit controls the driving of the brushless motor in response to the drive signal. The safety device includes a rotation detection element to detect the rotation state of the rotor of the brushless motor and output a rotation detection signal, and a switch for blocking a power supply line connected to the DC power supply circuit. The safety (Continued)

device controls the switch in response to the rotation detection signal and drive signal.

10 Claims, 5 Drawing Sheets

(51) Int. Cl.
 *F24C 7/08* (2006.01)
 *H02P 6/16* (2016.01)
 *H03K 19/21* (2006.01)

(58) Field of Classification Search
 USPC ....... 219/757, 689, 690, 694, 696, 697, 699, 219/702, 715, 716, 718, 719, 720
 See application file for complete search history.

(56) References Cited

FOREIGN PATENT DOCUMENTS

| | | |
|---|---|---|
| DE | 102013215846 | 2/2015 |
| JP | 5-030642 | 2/1993 |
| JP | 5-144561 | 6/1993 |
| JP | 11-113274 | 4/1999 |
| JP | 11-304162 | 11/1999 |
| JP | 2001-021146 | 1/2001 |
| JP | 2002-014703 | 1/2002 |
| JP | 2002-075622 | 3/2002 |
| JP | 2002-089848 | 3/2002 |
| JP | 2017-015365 | 1/2017 |

\* cited by examiner

| Signal A | Lo | Hi | Hi |
|---|---|---|---|
| Signal B1,B2 | Lo | Hi | Lo |
| Output X (switch 37, 38) | Hi (On) | Hi (On) | Lo (Off) |

HEATING COOKER

TECHNICAL FIELD

The present disclosure relates to a heating cooker, and more particularly to a safety device for a rotary drive mechanism included in the heating cooker.

BACKGROUND ART

Conventionally, a heating cooker including three functions, namely high-frequency heating, radiant heating, and convection heating, is known. This type of heating cooker includes, as a drive source of the rotary drive mechanism, a motor for a cooling fan for cooling a heating component, a motor for a circulation fan for convection heating, and a motor for driving a radiation mechanism for high-frequency heating.

As these motors, generally, shaded-pole motors are used because these motors have simple structures and are inexpensive. However, the shaded-pole motors have large and heavy structures although they have not so large output. The shaded-pole motors are inefficient and have a low rotation speed. The shaded-pole motors structurally cannot reverse the direction of their rotation.

Instead of a shaded-pole motor, a brushless DC (direct current) motor (hereinafter referred to as "brushless motor") can be employed. The brushless motor has a small size and a light weight. When the brushless motor is used, the rotation speed of the motor can be set higher, and the rotation of the motor can be more easily controlled. Recently, the cost of the motor also has decreased.

Thus, when a brushless motor is used as the drive source of the rotary drive mechanism in a heating cooker, there are many advantages. Patent Literature 1 discloses a heating cooker using a brushless motor as the drive source of the rotary drive mechanism.

CITATION LIST

Patent Literature

PTL 1: Unexamined Japanese Patent Publication No. 2017-15365

SUMMARY OF THE INVENTION

An electric apparatus has strict standards that are set from the viewpoint of safety. For example, some countries define safety standards demanding that, even when the rotor of the motor included in the electric apparatus is forcibly stopped, the temperature of the motor body is kept at a safe temperature.

The drive control in a brushless motor is performed by computer control. When a brushless motor is employed as a drive source of a rotary drive mechanism included in a heating cooker, the following system design is important: even if there is any problem in computer control, a serious situation such as a runaway of the system is not caused.

The present disclosure provides a heating cooker that uses a brushless motor as a drive source of a rotary drive mechanism. In this heating cooker, even when the rotor of the brushless motor is forcibly stopped, the temperature of the brushless motor can be kept at a safe temperature. Thus, the heating cooker is safe and reliable.

A heating cooker of a first aspect of the present disclosure includes a heating chamber, a heating portion, a brushless motor, a body control circuit, a DC power supply circuit, a motor control circuit, and a safety device.

The heating chamber accommodates an object to be heated. The heating portion heats the object to be heated in the heating chamber. The brushless motor is a drive source of a rotary drive mechanism included in the heating portion. The body control circuit outputs a drive signal for the brushless motor. The DC power supply circuit supplies DC power to the brushless motor. The motor control circuit controls the driving of the brushless motor in response to the drive signal.

A wired logic circuit constitutes the safety device. The safety device includes: a rotation detection element configured to detect a rotation state of the rotor of the brushless motor, and to output a rotation detection signal; and a switch configured to block a power supply line connected to the DC power supply circuit. The safety device controls the switch in response to the rotation detection signal and the drive signal.

In the present aspect, in the heating cooker that uses the brushless motor as the drive source of the rotary drive mechanism, even when the rotor of the brushless motor is forcibly stopped, the safety device certainly blocks the power supply line connected to the brushless motor. As a result, the present aspect can provide a safe and reliable heating cooker capable of keeping the temperature of the brushless motor at a safe temperature.

A wired logic circuit constitutes the safety device of the present aspect. Therefore, the safety device of the present aspect can safely stop the brushless motor even if a microcomputer runs out of control or a program has a bug.

DESCRIPTION OF EMBODIMENT(S)

Figure 1:
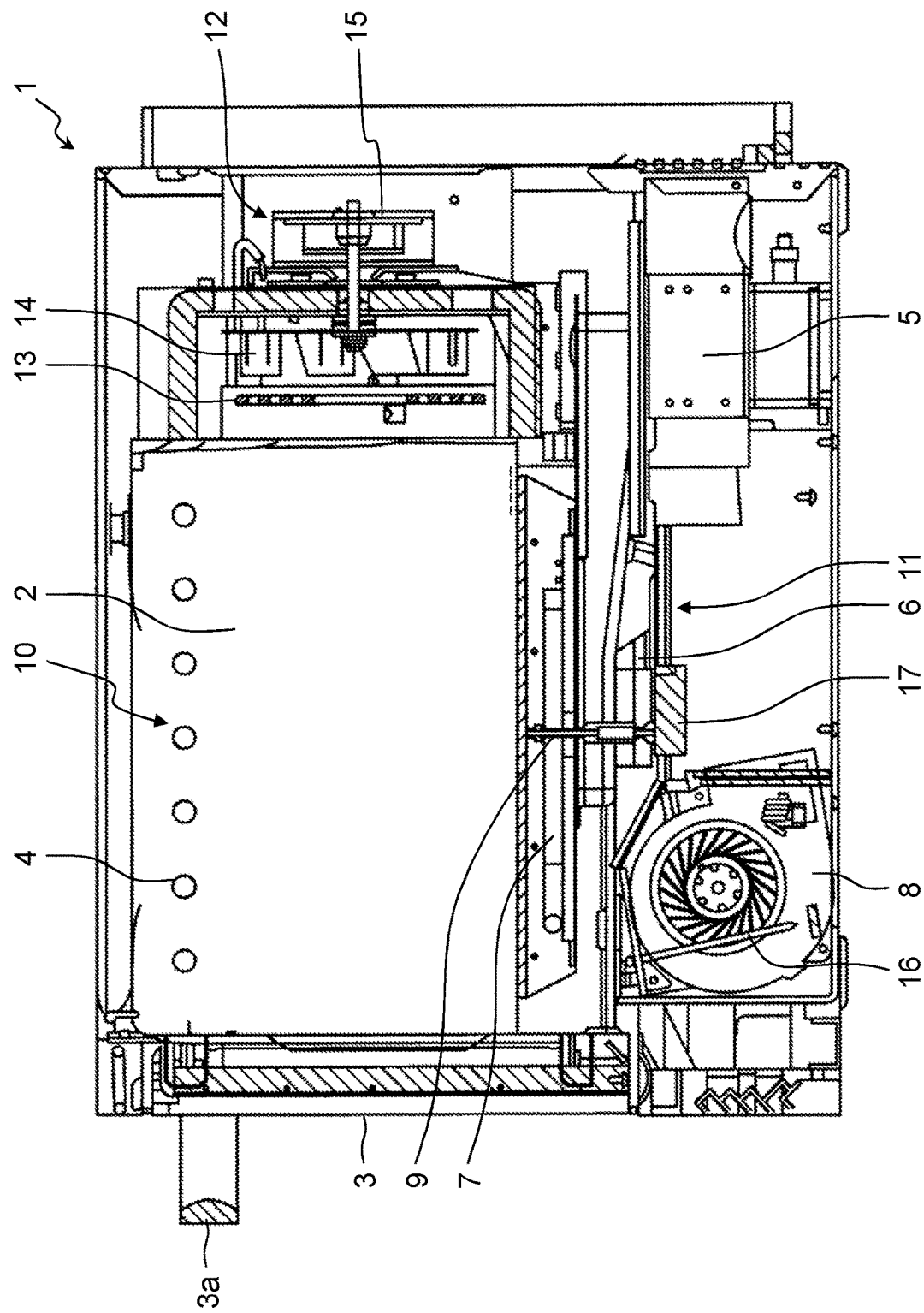
FIG. 1 is a side sectional view of a heating cooker according to an exemplary embodiment of the present disclosure.

A heating cooker of a first aspect of the present disclosure includes a heating chamber, a heating portion, a brushless motor, a body control circuit, a DC power supply circuit, a motor control circuit, and a safety device.

The heating chamber accommodates an object to be heated. The heating portion heats the object to be heated in the heating chamber. The brushless motor is a drive source of a rotary drive mechanism included in the heating portion. The body control circuit outputs a drive signal for the brushless motor. The DC power supply circuit supplies DC power to the brushless motor. The motor control circuit controls the driving of the brushless motor in response to the drive signal.

A wired logic circuit constitutes the safety device. The safety device includes: a rotation detection element configured to detect a rotation state of the rotor of the brushless motor, and to output a rotation detection signal; and a switch for blocking a power supply line connected to the DC power supply circuit. The safety device controls the switch in response to the rotation detection signal and drive signal.

In a heating cooker of a second aspect of the present disclosure, in addition to the first aspect, the safety device includes a first abnormality detection circuit and a second abnormality detection circuit. The rotation detection element includes a first rotation detection element and a second rotation detection element. The switch includes a first switch and second switch that are connected to the power supply line in series.

The first abnormality detection circuit controls the first switch in response to the drive signal and to a rotation detection signal output by the first rotation detection element. The second abnormality detection circuit controls the second switch in response to the drive signal and to a rotation detection signal output by the second rotation detection element.

In a heating cooker of a third aspect of the present disclosure, in addition to the second aspect, when the drive signal shows an operation command and when the rotation detection signal output by the first rotation detection element indicates a stop state of the rotor, the first abnormality detection circuit controls the first switch so as to block the power supply line.

When the drive signal shows an operation command, and when the rotation detection signal output by the second rotation detection element indicates a stop state of the rotor, the second abnormality detection circuit controls the second switch so as to block the power supply line.

In a heating cooker of a fourth aspect of the present disclosure, in addition to the first aspect, the heating portion includes a convection heating unit, and the brushless motor is used as a circulation fan motor for driving a circulation fan included in the convection heating unit.

In a heating cooker of a fifth aspect of the present disclosure, in addition to the first aspect, the heating portion includes a high-frequency heating unit, and the brushless motor is used as a cooling fan motor for driving a cooling fan included in the high-frequency heating unit.

In a heating cooker of a sixth aspect of the present disclosure, in addition to the first aspect, the heating portion includes a high-frequency heating unit, and the brushless motor is used as a drive motor for driving a radiation mechanism included in the high-frequency heating unit.

Hereinafter, the exemplary embodiment of the present disclosure will be described with reference to the accompanying drawings.

Any aspect of the exemplary embodiment is one specific example of the present disclosure. The numerical values, shapes, and configurations shown in the exemplary embodiment are examples, and do not restrict the present disclosure.

The following exemplary embodiment shows the configuration:
the safety device of the present disclosure is applied to the heating cooker that includes a high-frequency heating function, a radiant heating function, and a convection heating function.
However, the present disclosure is not restricted to such a heating cooker.

FIG. 1 is a side sectional view of heating cooker 1 according to the present exemplary embodiment. As shown in FIG. 1, heating cooker 1, inside its body, includes heating chamber 2 having a front opening. Door 3 is disposed in the front opening of heating chamber 2. Door 3 has a hinge (not shown) in its lower part, and has handle 3a on its upper part.

Door 3 includes an operation display unit (not shown) for setting cooking conditions and displaying the set cooking conditions. These conditions are a cooking temperature, a cooking time, and a type of the object to be heated, for example.

Heating cooker 1 includes three heating portions, namely grill heater unit 10, high-frequency heating unit 11, and convection heating unit 12.

Heating cooker 1 cooks the object to be heated, using the heating portion directly selected by a user or using the heating portion selected in accordance with the cooking conditions set by the user, of the three heating portions.

Grill heater unit 10 includes a plurality of rod-like grill heaters 4 disposed on the ceiling of heating chamber 2. Each grill heater 4 is constituted of a sheath heater, for example.

High-frequency heating unit 11 includes magnetron 5, waveguide 6, and radiation mechanism 9. High-frequency heating unit 11 supplies a microwave having been generated by magnetron 5 into heating chamber 2 via waveguide 6 using radiation mechanism 9.

Radiation mechanism 9 is an antenna disposed under the bottom surface of heating chamber 2 for radiating the microwave into heating chamber 2. Radiation mechanism 9 can change the radiation direction of the microwave with rotating stirrer wing 7.

Convection heating unit 12 includes convection heater 13 and circulation fan 14 that are disposed at the back of heating chamber 2. Convection heating unit 12 sucks the air in heating chamber 2 to heat it, and returns the heated air into heating chamber 2, thereby circulating the hot air in heating chamber 2.

Heating cooker 1 includes circulation fan motor 15, cooling fan motor 16, and stirrer motor 17 as a rotary drive mechanism. Circulation fan motor 15 drives circulation fan 14. Cooling fan motor 16 drives cooling fan 8 for cooling magnetron 5 or the like. Stirrer motor 17 is a drive motor for driving stirrer wing 7.

In the present exemplary embodiment, brushless motor 20 (see FIG. 2) is used as circulation fan motor 15, cooling fan motor 16, and stirrer motor 17.

Hereinafter, the safety device of the rotary drive mechanism used in heating cooker 1 will be described.

Figure 2:
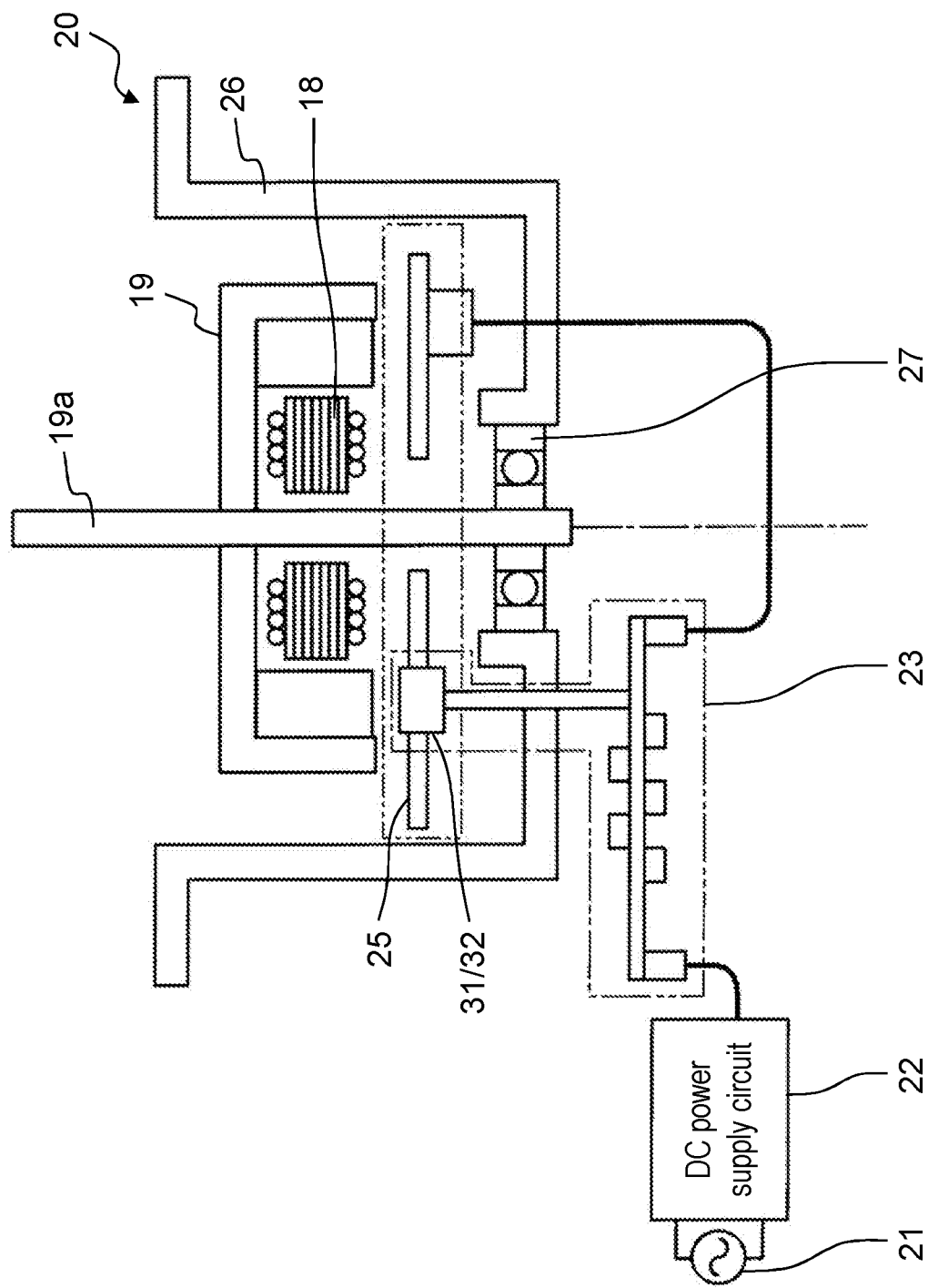
FIG. 2 is a schematic diagram showing a brushless motor as a drive source of a rotary drive mechanism included in the heating cooker of the present exemplary embodiment, and showing a circuit for driving and controlling the brushless motor.
Figure 3:
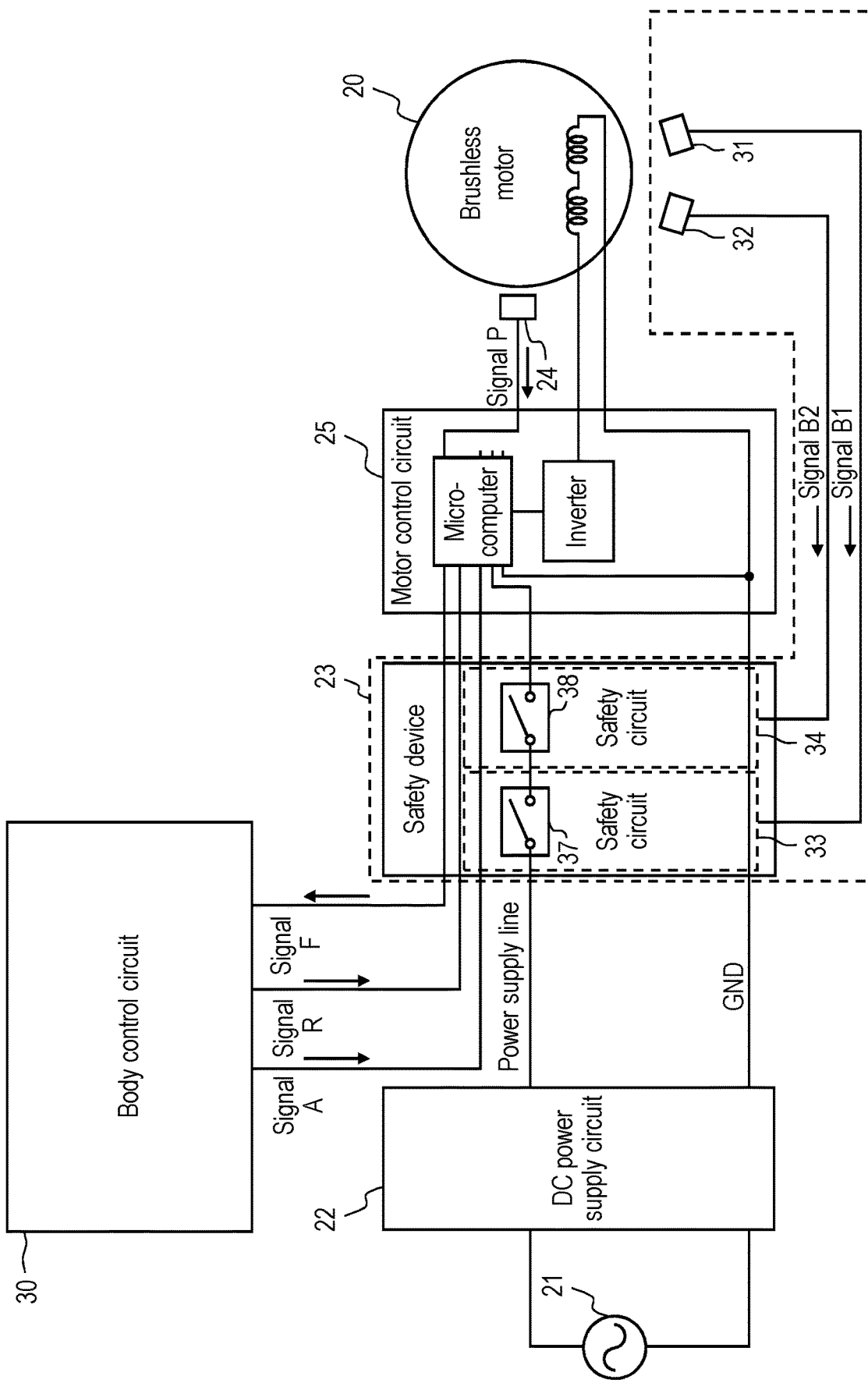
FIG. 3 is a block diagram of a drive circuit for the brushless motor as the drive source of the rotary drive mechanism included in the heating cooker of the present exemplary embodiment.

FIG. 2 is a schematic diagram of brushless motor 20 as a drive source of a rotary drive mechanism included in heating cooker 1, and a circuit for controlling the driving of brushless motor 20. FIG. 3 is a block diagram of a circuit for controlling the driving of brushless motor 20 as the drive source of the rotary drive mechanism included in heating cooker 1.

As shown in FIG. 2, brushless motor 20 includes motor case 26 for accommodating stator 18 and rotor 19. Motor case 26 rotatably holds rotation shaft 19a of rotor 19 via bearing 27.

In motor case 26, motor control circuit 25 is disposed adjacently to rotor 19. Motor control circuit 25 includes a microcomputer, and an inverter constituted of an insulated gate bipolar transistor (IGBT).

As shown in FIG. 2 and FIG. 3, DC power supply circuit 22 converts the alternating-current (AC) power of commercial power source 21 into DC power. Motor control circuit 25 receives the converted DC power via the power supply line having safety device 23. Safety device 23 is disposed outside motor case 26, and is constituted of a wired logic circuit that does not use program control by the microcomputer.

Position detection element 24 is disposed adjacently to rotor 19. Position detection element 24 is constituted of a Hall element, and detects the position of rotor 19.

Motor control circuit 25 receives position detection signal P output by position detection element 24, and transmits feedback signal F based on position detection signal P to body control circuit 30 of heating cooker 1.

Body control circuit 30 generates pulse width modulation (PWM) signal A and rotation direction signal R on the basis of feedback signal F, and transmits these signals to motor control circuit 25. PWM signal A is a signal for controlling the driving of brushless motor 20. Rotation direction signal R is a signal for specifying the rotation direction of brushless motor 20.

Motor control circuit 25 drives brushless motor 20 in response to PWM signal A and rotation direction signal R, which are transmitted from body control circuit 30.

Safety device 23 is disposed for forcibly blocking the power source in an abnormal condition in which rotor 19 does not rotate although body control circuit 30 is outputting PWM signal A, for example.

Specifically, safety device 23 includes safety circuits 33 and 34 that are connected in series. Motor control circuit 25 receives the DC power having been converted by DC power supply circuit 22, via the power supply line including safety circuits 33 and 34.

Safety device 23 forcibly blocks the power supply line when an abnormal condition occurs, using safety circuits 33 and 34 that operate independently. Safety circuits 33 and 34 correspond to first and second safety circuits, respectively.

Safety device 23 further includes rotation detection element 31 and rotation detection element 32 in order to detect a rotation abnormality of rotor 19. In order to detect the rotation of rotor 19, rotation detection elements 31 and 32 output rotation detection signals to be detected by a magnetic sensor, an optical sensor, and a vibration sensor, or the like.

In the present exemplary embodiment, rotation detection elements 31 and 32 are Hall elements disposed adjacently to rotor 19. Rotation detection elements 31 and 32 correspond to first and second rotation detection elements, respectively.

Safety circuit 33 receives rotation detection signal B1 output by rotation detection element 31. Safety circuit 34 receives rotation detection signal B2 output by rotation detection element 32.

Figure 4:
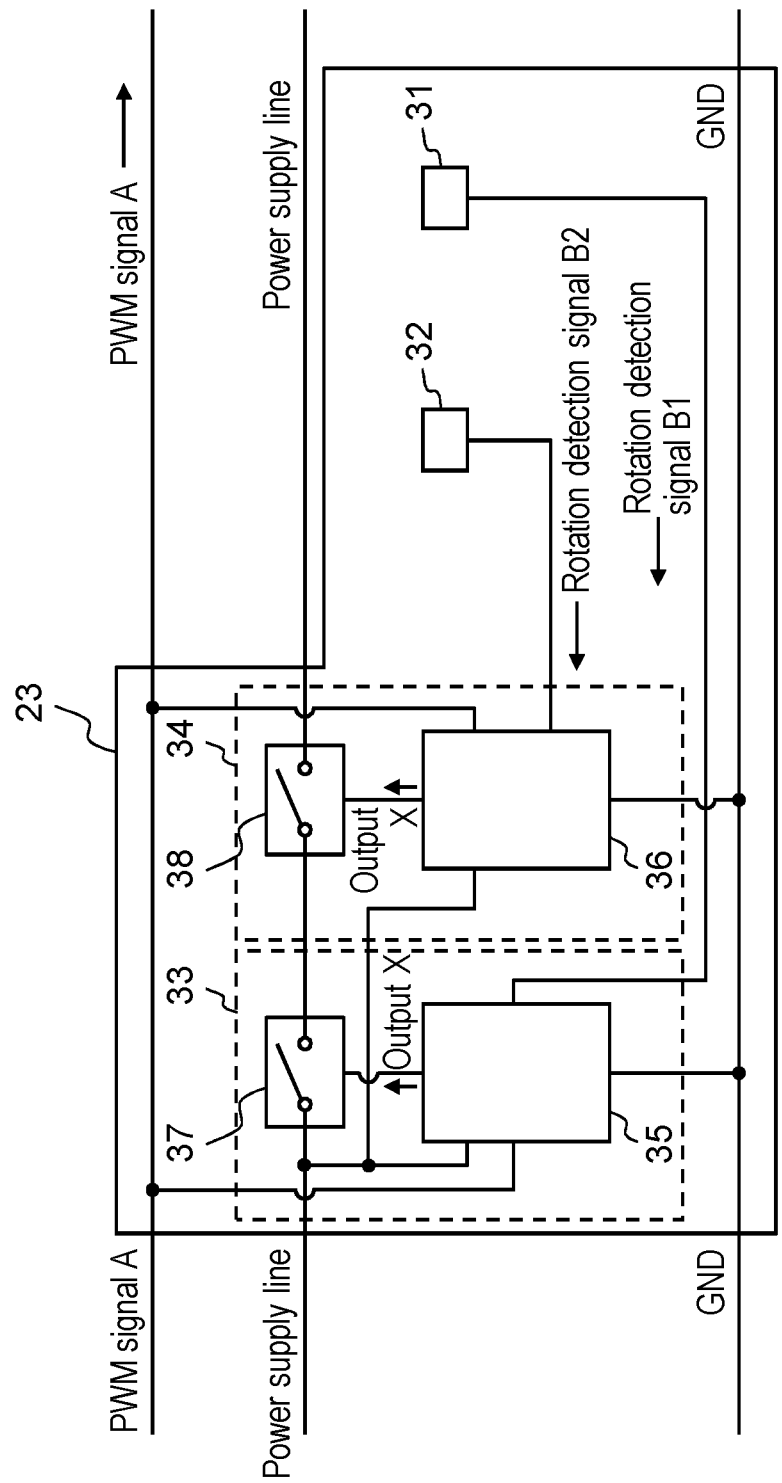
FIG. 4 is a block diagram of a safety device included in the heating cooker of the present exemplary embodiment.

FIG. 4 is a block diagram of safety device 23 included in heating cooker 1. As shown in FIG. 4, safety circuit 33 includes switch 37 and abnormality detection circuit 35. Abnormality detection circuit 35 receives rotation detection signal B1 and PWM signal A, and controls switch 37 on the basis of these signals.

Safety circuit 34 includes switch 38 and abnormality detection circuit 36. Abnormality detection circuit 36 receives rotation detection signal B2 and PWM signal A, and controls switch 38 on the basis of these signals.

Switches 37 and 38 are constituted of switching elements such as IGBTs. Switches 37 and 38 are connected to the power supply line in series so that, when at least one switch is blocked, the power supply line is blocked. Switches 37 and 38 correspond to first and second switches, respectively. Abnormality detection circuits 35 and 36 correspond to first and second abnormality detection circuits, respectively.

Figures 5A, 5B:
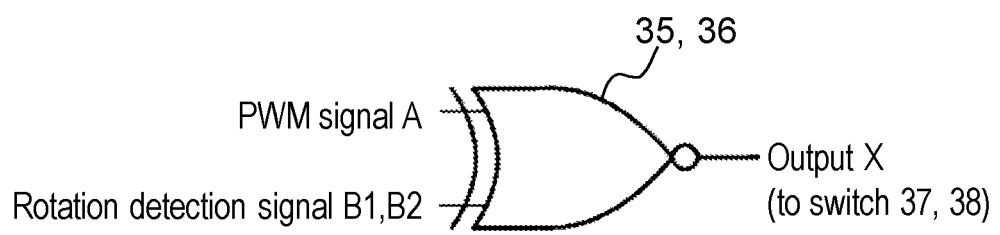
FIG. 5A is a diagram for showing a logic circuit for achieving the functions of a first and second abnormality detection circuits.
FIG. 5B is a diagram for showing a truth table of the logic circuit shown in FIG. 5A.

FIG. 5A shows a logic circuit (XNOR gate) for achieving the functions of abnormality detection circuits 35 and 36. FIG. 5B shows a truth table of the logic circuit described in FIG. 5A.

In the truth table of FIG. 5B, "Hi" in PWM signal A shows an operation command for brushless motor 20. "Lo" in PWM signal A shows a stop command for brushless motor 20.

"Hi" in rotation detection signals B1 and B2 shows the detection of a rotation state of rotor 19. "Lo" in rotation detection signals B1 and B2 shows no detection of the rotation state of rotor 19, namely shows the detection of the stop state of rotor 19.

"Hi" in output X in the logic circuit shown in FIG. 5A shows the ON signal for switches 37 and 38, and "Lo" shows the OFF signal for switches 37 and 38.

When PWM signal A is "Hi" and rotation detection signals B1 and B2 are "Lo" as shown in FIG. 5B, switches 37 and 38 are turned off to block the power supply line. As a result, when the rotation of rotor 19 is stopped unintentionally for some reason during the operation of brushless motor 20, safety device 23 blocks the power supply line to safely stop brushless motor 20.

The present exemplary embodiment includes safety circuits 33 and 34, which are disposed on the power supply line and include switches 37 and 38, respectively. However, the present disclosure is not restricted to this configuration. The safety device needs to include at least one safety circuit that has at least one switch that operates on the basis of the signal from at least one rotation detection element.

In the present aspect, the heating cooker that uses the brushless motor as the drive source of the rotary drive mechanism has the following configuration:

even when the rotor of the brushless motor is forcibly stopped, the safety device certainly blocks the power supply line connected to the brushless motor. As a result, the present aspect can provide a safe and reliable heating cooker capable of keeping the temperature of the brushless motor at a safe temperature.

INDUSTRIAL APPLICABILITY

As discussed above, the present disclosure can be applied to a heating cooker.

REFERENCE MARKS IN THE DRAWINGS 1 heating cooker
2 heating chamber
3 door
4 grill heater
5 magnetron
6 waveguide
7 stirrer wing
8 cooling fan
9 radiation mechanism
10 grill heater unit
11 high-frequency heating unit
12 convection heating unit
13 convection heater
14 circulation fan
15 circulation fan motor
16 cooling fan motor
17 stirrer motor
18 stator
19 rotor
20 brushless motor 21 commercial power source
22 DC power supply circuit
23 safety device
24 position detection element
25 motor control circuit
30 body control circuit
31, 32 rotation detection element
33, 34 safety circuit
35, 36 abnormality detection circuit
37, 38 switch

The invention claimed is:

1. A heating cooker comprising:
a heating chamber configured to accommodate an object to be heated;
a heater configured to heat the object to be heated in the heating chamber;
a brushless motor being a drive source of a rotary drive mechanism included in the heater;
a body control circuit configured to output a drive signal for the brushless motor;
a direct current (DC) power supply circuit configured to supply a DC power to the brushless motor;
a motor control circuit configured to control a driving of the brushless motor in response to the drive signal; and
a wired logic circuit including:
  a first sensor configured to detect a rotation state of a rotor of the brushless motor, and to output a first rotation detection signal;
  a second sensor configured to detect the rotation state of the rotor of the brushless motor, and to output a second rotation detection signal;
  a first switch coupled to a power supply line in series, the power supply line being coupled to the DC power supply circuit, the first switch being configured to block the power supply line; and
  a second switch coupled to the power supply line in series, the second switch being configured to block the power supply line,
wherein the wired logic circuit is configured to control the first switch in response to the first rotation detection signal and the drive signal and configured to control the second switch in response to the second rotation detection signal and the drive signal.

2. The heating cooker according to claim 1, wherein
when the drive signal shows an operation command, and when the first rotation detection signal output by the first sensor rotation detection element indicates a stop state of the rotor, the wired logic first abnormality detection circuit controls the first switch so as to block the power supply line, and
when the drive signal shows an operation command, and when the second rotation detection signal output by the second sensor rotation detection element indicates a stop state of the rotor, the wired logic second abnormality detection circuit controls the second switch so as to block the power supply line.

3. The heating cooker according to claim 1, wherein
the heater includes a convection heater, and
the brushless motor is a circulation fan motor for driving a circulation fan included in the convection heater.

4. The heating cooker according to claim 1, wherein
the heater includes a high-frequency heater, and
the brushless motor a cooling fan motor for driving a cooling fan included in the high-frequency heater.

5. The heating cooker according to claim 1, wherein
the heater includes a high-frequency heater, and
the brushless motor a drive motor for driving a radiation mechanism included in the high-frequency heater.

6. A heating cooker comprising:
a heating chamber configured to accommodate an object to be heated;
a heater configured to heat the object to be heated in the heating chamber;
a brushless motor being a drive source of a rotary drive mechanism included in the heater;
a body control circuit configured to output a drive signal for the brushless motor;
a direct current (DC) power supply circuit configured to supply a DC power to the brushless motor;
a motor control circuit configured to control a driving of the brushless motor in response to the drive signal; and
a wired logic circuit including:
  a first abnormality detection circuit;
  a second abnormality detection circuit;
  a first sensor configured to detect a rotation state of a rotor of the brushless motor, and to output a first rotation detection signal;
  a second sensor configured to detect the rotation state of the rotor of the brushless motor, and to output a second rotation detection signal;
  a first switch coupled to a power supply line in series, the power supply line being coupled to the DC power supply circuit, the first switch being configured to block the power supply line; and
  a second switch coupled to the power supply line in series, the second switch being configured to block the power supply line,
wherein the first abnormality detection circuit is configured to control the first switch in response to the drive signal and the first rotation detection signal, and
wherein the second abnormality detection circuit is configured to control the second switch in response to the drive signal and the second rotation detection signal.

7. The heating cooker according to claim 6, wherein
when the drive signal shows an operation command, and when the first rotation detection signal output by the first sensor indicates a stop state of the rotor, the first abnormality detection circuit controls the first switch so as to block the power supply line, and
when the drive signal shows an operation command, and when the second rotation detection signal output by the second sensor indicates a stop state of the rotor, the second abnormality detection circuit controls the second switch so as to block the power supply line.

8. The heating cooker according to claim 6, wherein
the heater includes a convection heater, and
the brushless motor is a circulation fan motor for driving a circulation fan included in the convection heater.

9. The heating cooker according to claim 6, wherein
the heater includes a high-frequency heater, and
the brushless motor is a cooling fan motor for driving a cooling fan included in the high-frequency heater.

10. The heating cooker according to claim 6, wherein
the heater includes a high-frequency heater, and
the brushless motor is a drive motor for driving a radiation mechanism included in the high-frequency heater.

* * * * *